US012642039B2

(12) United States Patent
Sasaki et al.

(10) Patent No.: US 12,642,039 B2
(45) Date of Patent: May 26, 2026

(54) BATCH SUBSTRATE TREATMENT APPARATUS

(71) Applicant: SCREEN Holdings Co., Ltd., Kyoto (JP)

(72) Inventors: Mitsutoshi Sasaki, Kyoto (JP); Manabu Yamamoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 363 days.

(21) Appl. No.: 18/319,396

(22) Filed: May 17, 2023

(65) Prior Publication Data

US 2024/0014050 A1 Jan. 11, 2024

(30) Foreign Application Priority Data

Jul. 11, 2022 (JP) ................................. 2022-110882

(51) Int. Cl.
| | | |
|---|---|---|
| *H10P 72/00* | (2026.01) | |
| *H10P 72/30* | (2026.01) | |
| *H10P 72/76* | (2026.01) | |

(52) U.S. Cl.
CPC ...... *H10P 72/0426* (2026.01); *H10P 72/0424* (2026.01); *H10P 72/3312* (2026.01);
(Continued)

(58) Field of Classification Search
CPC ......... H01L 21/67051; H01L 21/67057; H01L 21/6708; H01L 21/67086; H10P 72/0414;
(Continued)

(56) References Cited

U.S. PATENT DOCUMENTS

| | | | | |
|---|---|---|---|---|
| 4,753,258 A | * | 6/1988 | Seiichiro | ........... H01L 21/67023 |
| | | | | 134/99.1 |
| 4,967,777 A | * | 11/1990 | Takayama | ................. B08B 3/04 |
| | | | | 134/182 |

(Continued)

FOREIGN PATENT DOCUMENTS

| | | |
|---|---|---|
| JP | H06-333907 A | 12/1994 |
| JP | H08-195373 A | 7/1996 |

(Continued)

OTHER PUBLICATIONS

First Office Action with Search Report dated Jan. 7, 2025 in corresponding Taiwanese Patent Application No. 112119464 and an English machine translation based on a Japanese translation.
(Continued)

*Primary Examiner* — Kurt Sweely
(74) *Attorney, Agent, or Firm* — OSTROLENK FABER LLP

(57) ABSTRACT

An upward laminar flow of a treatment fluid is formed inside a treatment chamber. Substrates are immersed in the treatment fluid. Eight bubble supply pipes are disposed inside the treatment chamber, and supply bubbles in the treatment fluid from below the substrates. Two innermost bubble supply pipes out of the eight bubble supply pipes are disposed inside a recess of a punching plate so that the two bubble supply pipes are lower than the other bubble supply pipes. Even when a lifter lowers the substrates to an immersion position, an extremity of a back plate is prevented from hitting the two bubble supply pipes. Furthermore, the eight bubble supply pipes including the two innermost bubble supply pipes can uniformly supply bubbles to the surface of the substrates.

4 Claims, 6 Drawing Sheets

(52) U.S. Cl.
CPC ...... *H10P 72/7614* (2026.01); *H10P 72/0414*
(2026.01); *H10P 72/0416* (2026.01)

(58) Field of Classification Search
CPC ............. H10P 72/0416; H10P 72/0424; H10P
72/0426; H10P 72/3312; H10P 72/7614
See application file for complete search history.

(56) References Cited

U.S. PATENT DOCUMENTS

| | | | | |
|---|---|---|---|---|
| 5,000,795 A * | 3/1991 | Chung | .............. | H01L 21/67051 |
| | | | | 134/25.4 |
| 5,069,235 A * | 12/1991 | Vetter | ............... | H01L 21/67057 |
| | | | | 134/182 |
| 5,327,921 A * | 7/1994 | Mokuo | ............. | H01L 21/67057 |
| | | | | 134/182 |
| 5,730,162 A * | 3/1998 | Shindo | .............. | H01L 21/67781 |
| | | | | 414/937 |
| 5,875,804 A * | 3/1999 | Tanaka | ....................... | B08B 3/10 |
| | | | | 134/182 |
| 5,921,257 A * | 7/1999 | Weber | ............... | H01L 21/67057 |
| | | | | 257/E21.228 |
| 6,478,964 B1 * | 11/2002 | Redmon | ................... | C02F 7/00 |
| | | | | 210/220 |
| 7,156,927 B2 * | 1/2007 | Christenson | ........ | H01L 21/6708 |
| | | | | 134/28 |
| 7,243,911 B2 * | 7/2007 | Abiko | ............... | H01L 21/67057 |
| | | | | 261/122.1 |
| 8,020,839 B2 * | 9/2011 | Smiltneek | ........... | B01F 23/2311 |
| | | | | 261/DIG. 70 |
| 2020/0098597 A1 * | 3/2020 | Takahashi | ........... | H01L 21/6708 |
| 2021/0327729 A1 | 10/2021 | Takahashi et al. | | |
| 2023/0121666 A1 | 4/2023 | Takahashi et al. | | |

FOREIGN PATENT DOCUMENTS

| | | | |
|---|---|---|---|
| JP | 2000-012497 A | 1/2000 | |
| JP | 3003017 B2 | 1/2000 | |
| JP | 3008001 B2 | 2/2000 | |
| JP | 3196092 B2 | 8/2001 | |
| JP | 2020-047885 A | 3/2020 | |
| JP | 2020-136679 A | 8/2020 | |
| JP | 2021-106254 A | 7/2021 | |
| KR | 10-2021-0124425 A | 10/2021 | |
| TW | 202130424 A | 8/2021 | |

OTHER PUBLICATIONS

Request for Submission of an Opinion dated Jun. 20, 2024 in corresponding Korean Patent Application No. 10-2023-0075717 and a machine language translation obtained from the Global Dossier.

Notice of Reasons for Refusal dated Dec. 23, 2025 in corresponding Japanese Patent Application No. 2022-110882 with English language translation.

* cited by examiner

F I G. 5
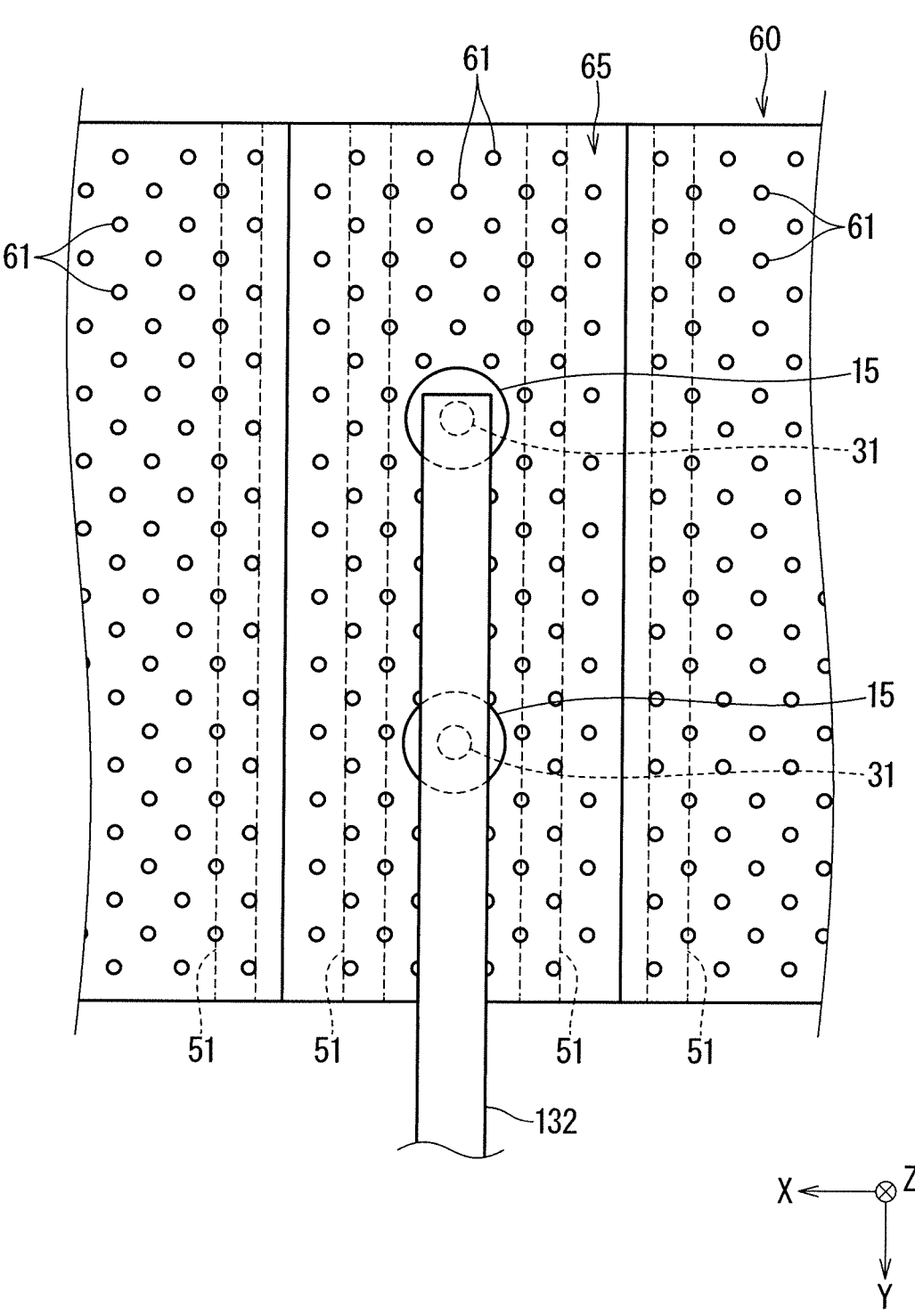

F I G. 7
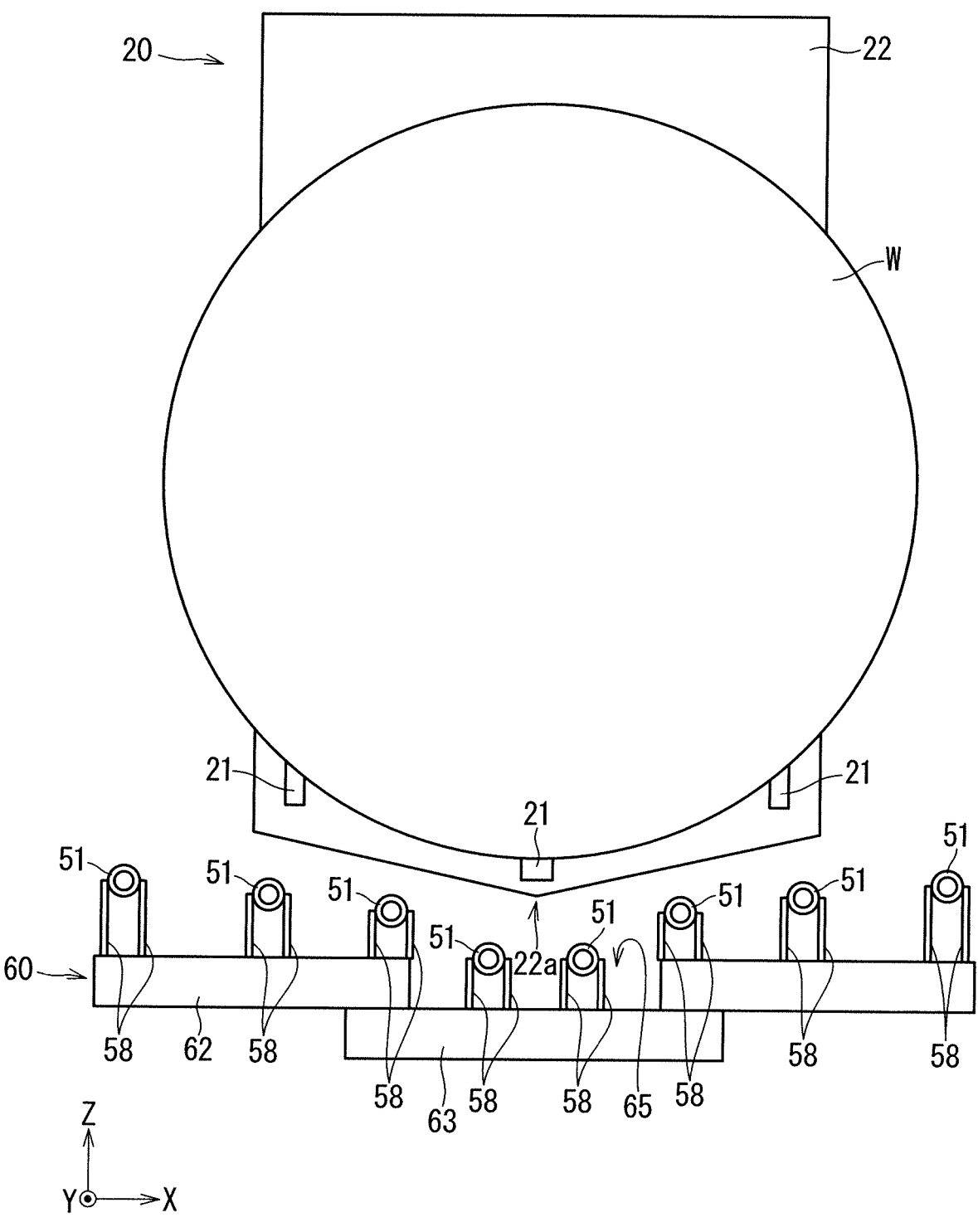

BATCH SUBSTRATE TREATMENT APPARATUS

BACKGROUND OF THE INVENTION

Field of the Invention

The present disclosure relates to a substrate treatment apparatus that subjects substrates to a surface treatment such as etching, using a treatment fluid. Examples of the substrates to be treated include a semiconductor substrate, a substrate for liquid crystal display, a substrate for flat panel display (FPD), a substrate for optical disk, a substrate for magnetic disk, and a substrate for solar cell.

Description of the Background Art

Conventionally, substrate treatment apparatuses that subject substrates such as semiconductor substrates to various treatments have been used in processes of manufacturing semiconductor devices. Batch substrate treatment apparatuses each of which stores a treatment fluid in treatment chambers, immerses a plurality of substrates in the treatment fluid in a batch, and, for example, etches the substrates are known as one type of the substrate treatment apparatuses.

Japanese Patent Application Laid-Open No. 2021-106254 discloses a treatment fluid ejector that ejects, in a treatment chamber, a treatment fluid to a lower portion of the plurality of substrates held by a substrate holder, and bubblers that supply bubbles. Supply of the bubbles in the treatment fluid in addition to ejection of the treatment fluid accelerates the velocity of the treatment fluid in the treatment chamber, and increases the efficiency of the surface treatment on the substrates.

Recently, people pay attention to efforts toward achieving the sustainable development goals (SDGs). Thus, liquid-saving for reducing treatment fluids to be dumped as much as possible has been sought. To meet such a request, treatment chambers in each of which a substrate treatment with a less amount of treatment fluid is possible have been developed.

However, such treatment chambers with a reduced capacity are smaller in dimension. Thus, the arrangement of the bubblers is restricted. Specifically, the bubblers cannot be disposed in a movable range of a lifter that holds the plurality of substrates and moves upward and downward. This causes displacements of the arrangement of the bubblers, and consequently creates problems of failing to uniformly supply bubbles to the surface of the substrates and impairing the in-plane uniformity in the substrate treatment.

SUMMARY

The present disclosure is directed to a substrate treatment apparatus that subjects substrates to a surface treatment using a treatment fluid.

According to an aspect of this disclosure, the substrate treatment apparatus includes: a treatment chamber storing the treatment fluid; a treatment fluid supplying part supplying the treatment fluid into the treatment chamber; a punching plate disposed in the treatment chamber, the punching plate forming a laminar flow of the treatment fluid supplied from the treatment fluid supplying part; a lifter holding the substrate and moving upward and downward, the lifter immersing the substrate in the treatment fluid stored in the treatment chamber; and a plurality of tubular bubble supply pipes disposed above the punching plate inside the treatment chamber, the bubble supply pipes supplying, from below the substrate held by the lifter, bubbles in the treatment fluid stored in the treatment chamber, wherein the punching plate includes a recess, and a part of the plurality of bubble supply pipes is disposed inside the recess.

Since the punching plate includes a recess and a part of the plurality of bubble supply pipes is disposed inside the recess, the plurality of bubble supply pipes can uniformly supply bubbles to the surface of the substrates while interference between the bubble supply pipes and the lifter is suppressed.

Preferably, the plurality of bubble supply pipes are made of a fluorocarbon polymer, and the substrate treatment apparatus further includes support components supporting each of the bubble supply pipes above the punching plate.

This can reduce warping of the bubble supply pipes and increase the straightness.

Therefore, the object of this disclosure is to suppress the interference between the bubble supply pipes and the lifter and uniformly supply bubbles to the surface of the substrates.

These and other objects, features, aspects, and advantages of the present invention will become more apparent from the following detailed description of the present invention when taken in conjunction with the accompanying drawings.

BRIEF DESCRIPTION OF THE DRAWINGS

FIG. 5 illustrates nozzles, distribution plates, and a punching plate when viewed from the bottom of treatment chambers;

FIG. 7 is a front view illustrating a structure of the punching plate and the eight bubble supply pipes.

DESCRIPTION OF THE PREFERRED EMBODIMENTS

Hereinafter, an embodiment of the present disclosure will be described in detail with reference to the drawings. Unless otherwise noted, the expressions indicating relative or absolute positional relationships (e.g., "in one direction", "along one direction", "parallel", "orthogonal", "central", "concentric", and "coaxial") include those exactly indicating the positional relationships and those where an angle or a distance is relatively changed within tolerance or to the extent that similar functions can be obtained. Unless otherwise noted, the expressions indicating equality (e.g., "same", "equal", "uniform", and "homogeneous") include those indicating quantitatively exact equality and those in the presence of a difference within tolerance or to the extent that similar functions can be obtained. Unless otherwise noted, the expressions indicating shapes (e.g., "circular", "rectangular" or "cylindrical") include those indicating geometrically exact shapes and those indicating, for example, roughness or a chamfer to the extent that similar advantages can be obtained. An expression "comprising", "including", "containing", or "having" a certain constituent element is not an exclusive expression for excluding the presence of the other constituent elements. An expression "at least one of A, B, or C" involves "only A", "only B", "only C", "arbitrary two of A, B, and C", and "all of A, B, and C".

Figure 1:
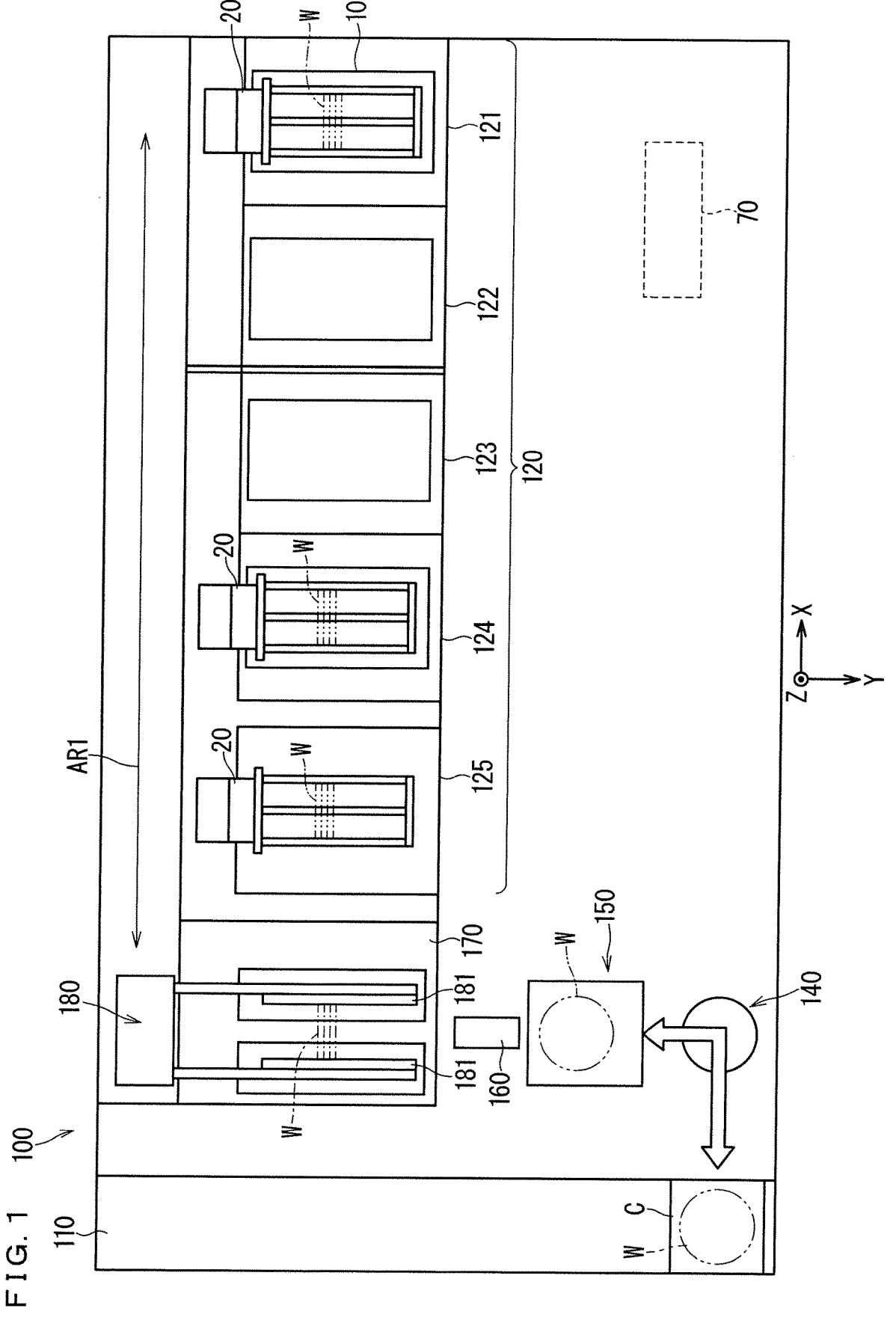
FIG. 1 is a plan view illustrating in diagrammatic form an overall structure of a substrate treatment apparatus according to the present disclosure.

FIG. 1 is a plan view illustrating in diagrammatic form an overall structure of a substrate treatment apparatus 100 according to the present disclosure. The substrate treatment apparatus 100 is a batch substrate treatment apparatus that subjects substrates W such as a plurality of semiconductor substrates to a surface treatment in a batch, using a treatment fluid. It should be noted that dimensions and the number of components in FIG. 1 and the subsequent figures are shown in exaggeration or in simplified form as appropriate for the sake of easier understanding. Furthermore, FIG. 1 and the subsequent figures appropriately illustrate an XYZ rectangular coordinate system for clarifying the direction relationship, using the Z-axis direction as a vertical direction and an XY plane as a horizontal surface.

The substrate treatment apparatus 100 mainly includes a load port 110, a loading/unloading robot 140, a posture transformation mechanism 150, a pusher 160, a main transport robot 180, a substrate treatment part group 120, a transfer cassette 170, and a controller 70.

The load port 110 is disposed at an end of the substrate treatment apparatus 100 that is shaped as an approximate rectangle in a plan view. A carrier C that houses a plurality of substrates (simply referred to as "substrates") W to be treated in the substrate treatment apparatus 100 is placed in the load port 110. The carrier C that houses the substrates W to be treated is transported by, for example, an unmanned transport vehicle (AGV, OHT), and is placed in the load port 110. The carrier C that houses the treated substrates W is also carried away from the load port 110 by the unmanned transport vehicle.

The carrier C is typically a front opening unified pod (FOUP) that houses the substrates W in an airtight space. The carrier C holds the plurality of substrates W stacked in a vertical direction (Z direction) at regular intervals in a plurality of holding shelves disposed inside the carrier C, in a horizontal attitude (an attitude such that the normal coincides with the vertical direction). The maximum number of the substrates W that can be housed in the carrier C is 25 or 50. Besides the FOUP, the carrier C may be a Standard Mechanical Interface (SMIF) pod or an open cassette (OC) that exposes the housed substrates W to outside air.

A pod opener (not illustrated) is disposed at a boundary between the body of the substrate treatment apparatus 100 and the load port 110. The pod opener opens and closes a lid on the front surface of the carrier C placed in the load port 110.

The loading/unloading robot 140 transports the substrates W to be treated from the carrier C into the body of the substrate treatment apparatus 100, and also transports the treated substrates W from the body of the substrate treatment apparatus 100 into the carrier C, while the lid of the carrier C placed in the load port 110 is opened. Specifically, the loading/unloading robot 140 transports the substrates W between the carrier C and the posture transformation mechanism 150. The loading/unloading robot 140 is pivotable on the horizontal surface, and includes a movable batch hand (not illustrated) including a plurality of hand elements which are stacked in multiple layers and each of which can hold one of the substrates W.

The posture transformation mechanism 150 rotates the substrates W received from the loading/unloading robot 140 at a 90° angle, and transforms the attitude of the substrates W from the horizontal attitude to a standing attitude (an attitude such that the normal coincides with the horizontal direction). Furthermore, the posture transformation mechanism 150 transforms the attitude of the substrates W from the standing attitude to the horizontal attitude before passing the substrates W to the loading/unloading robot 140.

The pusher 160 is disposed between the posture transformation mechanism 150 and the transfer cassette 170. The pusher 160 passes the substrates W in the standing posture, between the posture transformation mechanism 150 and a lifting/lowering stage (not illustrated) disposed in the transfer cassette 170.

The transfer cassette 170 and the substrate treatment part group 120 are aligned in a row in the X direction. The substrate treatment part group 120 includes five treatment parts 121, 122, 123, 124, and 125. The treatment parts 121 to 125 are main parts of the substrate treatment apparatus 100 that subjects the substrates W to various surface treatments. As illustrated in FIG. 1, the treatment parts 121, 122, 123, 124, and 125 are disposed in this order from the +X side in the substrate treatment apparatus 100. Each of the treatment parts 121, 122, 123, and 124 includes a treatment chamber 10 that stores a treatment fluid.

The treatment parts 121 and 123 store respective chemical solutions of the same kind or different kinds, and immerse the plurality of substrates W in the chemical solutions in a batch to subject the substrates W to a chemical solution treatment such as etching. Furthermore, the treatment parts 122 and 124 store respective rinse solutions (typically, de-ionized water), and immerse the plurality of substrates W in the rinse solutions in a batch to subject the substrates W to a rinse treatment.

In the substrate treatment part group 120, the treatment parts 121 and 122 are paired, and the treatment parts 123 and 124 are paired. Furthermore, one lifter 20 that is a dedicated transport mechanism is provided for the pair of the treatment parts 121 and 122. The lifter 20 is movable along the X direction between the treatment parts 121 and 122. Similarly, another lifter 20 that is a dedicated transport mechanism is provided for the pair of the treatment parts 123 and 124.

The lifter 20 holds the plurality of substrates W received from the main transport robot 180, and immerses the plurality of substrates W in the chemical solution stored in the treatment chamber 10 of the treatment part 121. After the chemical solution treatment, the lifter 20 lifts the substrates W from the treatment part 121, transfers the substrates W to the treatment part 122, and immerses the substrates W in the rinse solution stored in the treatment chamber of the treatment part 122. After the rinse treatment, the lifter 20 lifts the substrates W from the treatment part 122, and passes the substrates W to the main transport robot 180.

The treatment part 125 includes a mechanism for reducing a pressure of an airtight drying chamber to less than an atmospheric pressure, a mechanism for supplying an organic solvent (e.g., isopropyl alcohol (IPA)) to the drying chamber, and another lifter 20. The treatment part 125 houses, into the drying chamber, the substrates W received from the main transport robot 180 through the lifter 20, reduces the pressure in the drying chamber to a reduced atmospheric pressure, and dries the substrates W by supplying the organic solvent to the substrates W. The treatment part 125 passes the dried substrates W to the main transport robot 180 through the lifter 20.

The transfer cassette 170 is disposed below the main transport robot 180 at a wait position (a position of the main transport robot 180 in FIG. 1). The transfer cassette 170 includes the lifting/lowering stage that is not illustrated. The lifting/lowering stage raises the substrates W received from the pusher 160 while maintaining the substrates W in the standing posture as they are, and passes the substrates W to the main transport robot 180. Furthermore, the lifting/lowering stage lowers the substrates W received from the main transport robot 180, and passes the substrates W to the pusher 160.

The main transport robot 180 is configured to perform a sliding movement in the X direction as indicated by an arrow AR1 in FIG. 1. The main transport robot 180 transports the substrates W between the wait position above the transfer cassette 170 and a treatment position above one of the treatment parts 121, 122, 123, 124, and 125.

The main transport robot 180 includes a pair of substrate chucks 181 that holds the plurality of substrates W in a batch. The main transport robot 180 can hold the plurality of substrates W in a batch by narrowing a distance between the pair of substrate chucks 181, and release the holding state by increasing the distance between the substrate chucks 181. The main transport robot 180 with such a structure can pass and receive the substrates W not only to and from the lifting/lowering stage of the transfer cassette 170 but also to and from each of the lifters 20 disposed in the substrate treatment part group 120.

Figure 2:
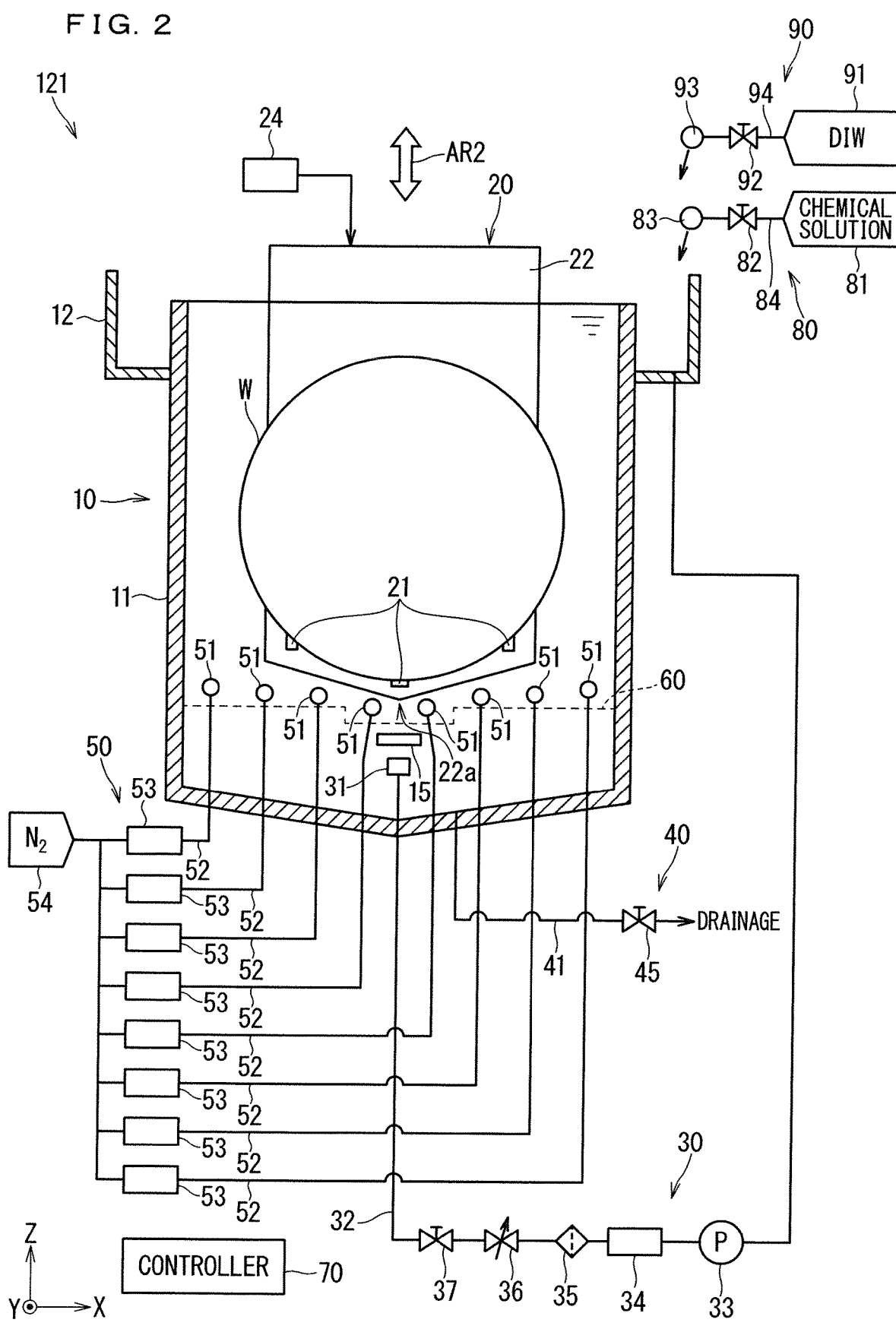
FIG. 2 illustrates a structure of a treatment part in the substrate treatment apparatus in FIG. 1.

Next, a structure of the treatment part 121 disposed in the substrate treatment apparatus 100 will be described. The treatment part 123 has the same structure as that of the treatment part 121 described herein. FIG. 2 illustrates the structure of the treatment part 121. As illustrated in FIG. 2, the treatment part 121 mainly includes: the treatment chamber storing a treatment fluid; the lifter 20 that holds the plurality of substrates W and moves upward and downward; a treatment fluid supplying part 30 that supplies the treatment fluid into the treatment chamber 10; a drainage part 40 that drains the treatment fluid from the treatment chamber 10; and a bubble supplying part 50 that supplies bubbles into the treatment fluid stored in the treatment chamber 10.

The treatment chamber 10 is a storage container made of a material with tolerance to chemical solutions, such as quartz. The treatment chamber 10 has a double-chamber structure including an inner chamber 11 which stores the treatment fluid and inside of which the substrates W are immersed, and an outer chamber 12 formed around an outer periphery of an upper end of the inner chamber 11. Each of the inner chamber 11 and the outer chamber 12 has an upper opening opened upward. The upper edge of the outer chamber 12 is higher than the upper edge of the inner chamber 11. When the treatment fluid is stored up to the upper end of the inner chamber 11 and the treatment fluid supplying part 30 further supplies the treatment fluid, the treatment fluid spills from the upper portion of the inner chamber 11, and overflows to the outer chamber 12. The treatment chamber 10 according to the embodiment is a chamber with liquid-saving specification designed to reduce the amount of the treatment fluid to be used. Thus, the capacity of the inner chamber 11 is relatively small.

The "treatment fluids" in this Description are conceptual terms meaning various chemical solutions and de-ionized water. Examples of the chemical solutions include an etching solution and a solution for removing particles, and specifically include tetramethylammonium hydroxide (TMAH), an SC-I solution (a mixed solution of ammonium hydroxide, a hydrogen peroxide solution, and de-ionized water), an SC-II solution (a mixed solution of hydrochloric acid, a hydrogen peroxide solution, and de-ionized water), and phosphoric acid. The chemical solutions include chemical solutions dissolved in de-ionized water.

The lifters 20 are transport mechanisms for transporting the substrates W upward and downward while holding the substrates W. Each of the lifters 20 includes a back plate 22 extending in the vertical direction (Z direction), and three retention bars 21 extending from the lower end of the back plate 22 in the horizontal direction (Y direction). The lower end of the back plate 22 is V-shaped. Specifically, an extremity 22a at the center of the lower end of the back plate 22 is located at the lowest position. The lower end of the back plate 22 is inclined diagonally upward from the extremity 22a toward both lateral sides of the back plate 22. Each of the three retention bars 21 extending from the lower end of the back plate 22 includes a plurality of retention ditches (e.g., 50 retention ditches) formed with predetermined pitches. The plurality of substrates W are held parallel to each other at regular spacings in the standing posture on the three retention bars 21, with peripheral portions of the substrates W being engaged in the retention ditches.

Figure 3:
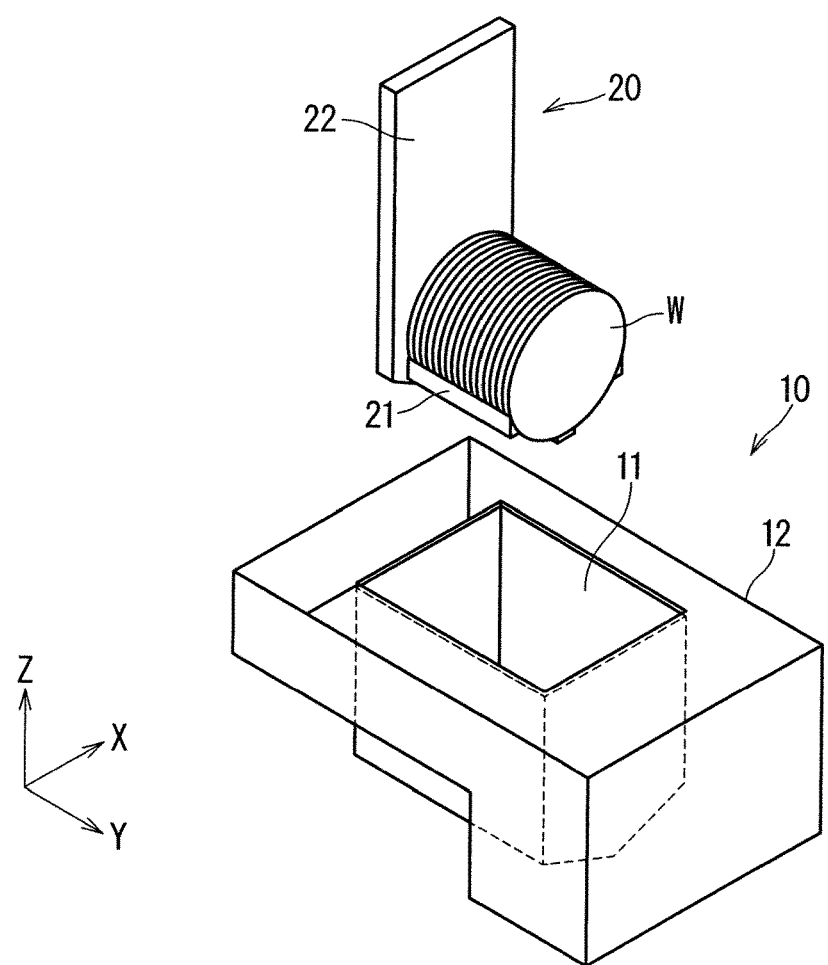
FIG. 3 illustrates a state where a lifter moves upward.
Figure 4:
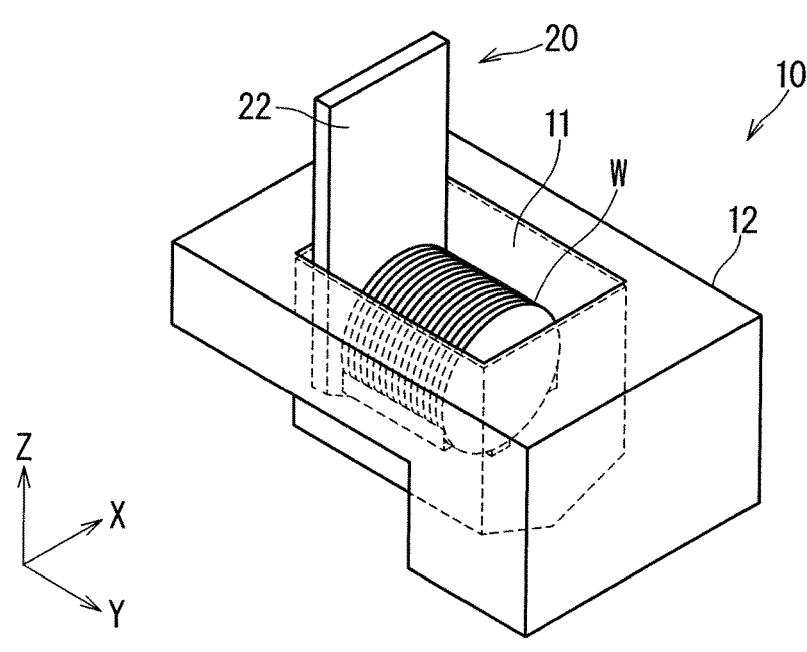
FIG. 4 illustrates a state where the lifter moves downward.

Furthermore, the lifter 20 is connected to a driving mechanism 24 conceptually illustrated in FIG. 2. The driving mechanism 24 causes the lifter 20 to move upward and downward. FIGS. 3 and 4 illustrate upward and downward operations of the lifter 20. When the driving mechanism 24 is operated, the lifter 20 moves upward and downward. As indicated by an arrow AR2 in FIG. 2, the substrates W held by the lifter 20 are moved upward and downward between an immersion position inside the treatment chamber 10 (a position in FIG. 4) and a lifting position above the treatment chamber 10 (a position in FIG. 3). When the substrates W are lowered to the immersion position with the treatment fluid being stored in the treatment chamber 10, the substrates W are immersed in the treatment fluid and subjected to the surface treatment.

Referring again to FIG. 2, the treatment fluid supplying part 30 includes a nozzle 31, and a pipe line that feeds the treatment fluid to the nozzle 31. The nozzle 31 is disposed at the bottom of the inner chamber 11 of the treatment chamber 10. A distribution plate 15 is disposed immediately above the nozzle 31 to face the nozzle 31. Furthermore, a punching plate 60 is disposed above the distribution plate 15.

FIG. 5 illustrates the nozzles 31, the distribution plates 15, and the punching plate 60 when viewed from the bottom of the treatment chambers 10. A pipe 132 includes tips (portions extending into the treatment chambers 10) of pipes 32 of the treatment fluid supplying parts 30. The plurality of nozzles 31 are disposed at upper portions of the pipe 132. Each of the nozzles 31 is connected in communication with the pipe 132. The distribution plate 15 is disposed above each of the nozzles 31. The distribution plates 15 are disk-shaped parts parallel to the horizontal surface. The nozzles 31 protrude vertically upward from the pipe 132 toward the distribution plates 15. The punching plate 60 is disposed across the entire horizontal cross-section of the inner chambers 11 further above the distribution plates 15. A plurality of treatment fluid holes 61 are formed on the entire surface of the punching plate 60.

The treatment fluid fed to the pipe 132 is ejected from the nozzles 31 toward the distribution plates 15 immediately above the nozzles 31. When the treatment fluid is ejected upward from the nozzles 31 with the treatment fluid being stored in the treatment chambers 10, the flow of the treatment fluid hits the distribution plates 15 to distribute the pressure of the treatment fluid. Consequently, the treatment fluid spreads in the horizontal direction along the plane of the distribution plates 15. Then, the treatment fluid spread by the distribution plates 15 in the horizontal direction rises from the plurality of treatment fluid holes 61 of the punching plate 60 to form a laminar flow of the treatment fluid in the treatment chambers 10 from downward to upward. In other words, the punching plate 60 forms the laminar flow of the treatment fluid in the treatment chambers 10.

Referring again to FIG. 2, the pipe line that feeds the treatment fluid to the nozzle 31 includes a pump 33, a heater 34, a filter 35, a flow adjustment valve 36, and a valve 37 all of which are disposed in the pipe 32. The pump 33, the heater 34, the filter 35, the flow adjustment valve 36, and the valve 37 are disposed in this order from upstream to downstream of the pipe 32 (from the outer chamber 12 to the inner chamber 11).

The tips of the pipes 32 extending into the treatment chambers 10 become the pipe 132 (FIG. 5), and the base ends of the pipes 32 are connected to the respective outer chambers 12. Each of the pipes 32 guides the treatment fluid flowing out of the outer chamber 12 again to the inner chamber 11. In other words, the treatment fluid supplying part 30 circulates the treatment fluid in the treatment chamber 10. The pump 33 discharges the treatment fluid from the outer chamber 12 to the pipe 32, and delivers the treatment fluid to the nozzle 31. The heater 34 heats the treatment fluid flowing through the pipe 32. When, for example, phosphoric acid is used as the treatment fluid, the heater 34 heats the treatment fluid, and stores, in the treatment chamber 10, the treatment fluid whose temperature has been increased.

The filter 35 filters the treatment fluid flowing through the pipe 32 to remove, for example, impurities. The flow adjustment valve 36 adjusts a flow rate of the treatment fluid flowing through the pipe 32. The valve 37 opens and closes the flow passage of the pipe 32. When the valve 37 is opened with the pump 33 being operated, the treatment fluid discharged from the outer chamber 12 flows through the pipe 32 to feed the treatment fluid to the nozzle 31. The flow adjustment valve 36 defines the flow rate of the treatment fluid.

A chemical solution supplying part 80 includes a chemical solution supplying source 81, a valve 82, a nozzle 83, and a pipe 84. A tip of the pipe 84 is connected to the nozzle 83, and a base end of the pipe 84 is connected to the chemical solution supplying source 81. The valve 82 is inserted at some midpoint in the pipe 84. When the valve 82 is opened, the chemical solution supplying source 81 feeds a chemical solution to the nozzle 83. The nozzle 83 ejects the chemical solution toward the outer chamber 12 of the treatment chamber 10. The treatment fluid supplying part 30 supplies, in the inner chamber 11, the chemical solution supplied from the chemical solution supplying part 80 to the outer chamber 12. The nozzle 83 of the chemical solution supplying part 80 may directly supply the chemical solution to the inner chamber 11.

A DIW supplying part 90 includes a DIW supplying source 91, a valve 92, a nozzle 93, and a pipe 94. A tip of the pipe 94 is connected to the nozzle 93, and a base end of the pipe 94 is connected to the DIW supplying source 91. The valve 92 is inserted at some midpoint in the pipe 94. When the valve 92 is opened, the DIW supplying source 91 feeds de-ionized water to the nozzle 93. The nozzle 93 ejects the de-ionized water toward the outer chamber 12 of the treatment chamber 10. Thereby, supply of the chemical solution from the chemical solution supplying part 80 to the treatment chamber 10 and supply of the de-ionized water from the DIW supplying part 90 to the treatment chamber dilutes the chemical solution with the de-ionized water.

The drainage part 40 includes a pipe 41 and a valve 45. A tip of the pipe 41 is connected to a bottom wall of the inner chamber 11 of the treatment chamber 10. The valve is inserted at some midpoint in the pipe 41. The base end of the pipe 41 is connected to drainage equipment of a factory in which the substrate treatment apparatus 100 is installed. When the valve 45 is opened, the treatment fluid stored in the inner chamber 11 is quickly drained from the bottom of the inner chamber 11 to the pipe 41, and treated by the drainage equipment.

The bubble supplying part 50 includes a plurality of bubble supply pipes (bubblers) 51, and a pipe line that feeds gas to the bubble supply pipes 51. In this embodiment, the bubble supplying part 50 includes eight bubble supply pipes 51. The eight bubble supply pipes 51 are disposed inside the inner chamber 11 of the treatment chamber above the punching plate 60 and below the substrates W held by the lifter 20 at the immersion position. Each of the eight bubble supply pipes 51 ejects the gas into the treatment fluid stored in the treatment chamber 10. When the eight bubble supply pipes 51 supply the gas into the treatment fluid stored in the treatment chamber 10, the gas is transformed into bubbles, and the bubbles rise in the treatment fluid. The gas supplied by the bubble supplying part 50 is, for example, an inert gas. The inert gas is, for example, nitrogen or argon (nitrogen is used in the embodiment).

The pipe line that feeds the gas to the eight bubble supply pipes 51 includes pipes 52, gas supplying mechanisms 53, and a gas supply source 54. Each of the eight bubble supply pipes 51 is connected to a tip of one of the pipes 52. Base ends of the pipes 52 are connected to the gas supply source 54. Furthermore, the pipes 52 are equipped with the respective gas supplying mechanisms 53. In other words, each of the eight bubble supply pipes 51 is equipped with one of the gas supplying mechanisms 53. The gas supply source 54 delivers the gas to each of the pipes 52. Each of the gas supplying mechanisms 53 includes a mass flow controller and an open/close valve that are not illustrated, and feeds the gas to the bubble supply pipe 51 through the pipe 52 and adjusts a flow rate of the gas to be fed.

Figure 6:
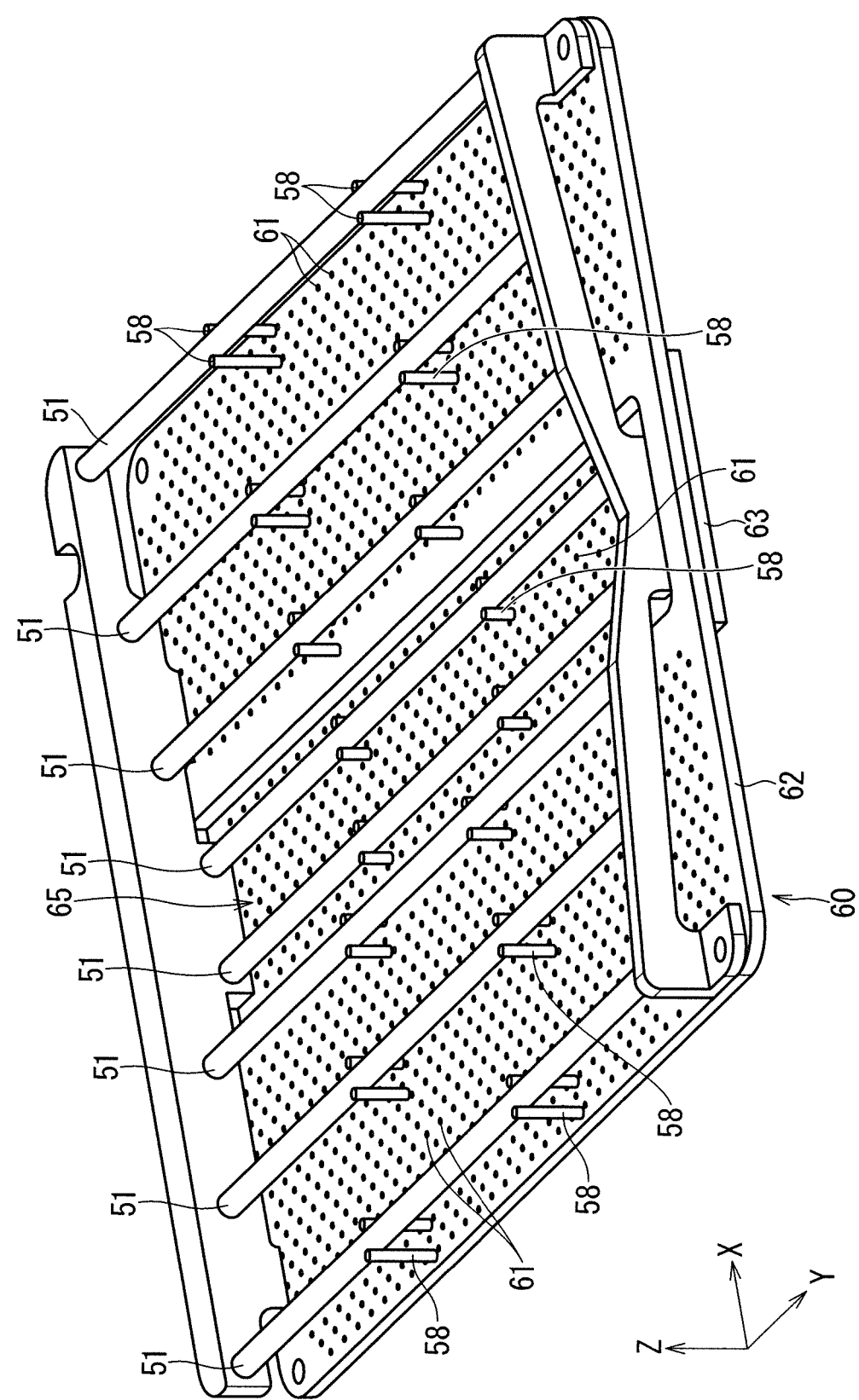
FIG. 6 is a perspective view illustrating an arrangement of eight bubble supply pipes with respect to the punching plate.

FIG. 6 is a perspective view illustrating an arrangement of the eight bubble supply pipes 51 with respect to the punching plate 60. FIG. 7 is a front view illustrating a structure of the punching plate 60 and the eight bubble supply pipes 51. The punching plate 60 is obtained by bonding a bottom plate 63 to an upper plate 62. The upper plate 62 includes an opening extending through its center. The bottom plate 63 is bonded to the upper plate 62 to close the lower portion of the opening. The bottom plate 63 is secured to the upper plate 62, for example, using screws and hexagon nuts. Closing the lower portion of the opening of the upper plate 62 by the bottom plate 63 forms a recess 65 in a center of the punching plate 60. The plurality of treatment fluid holes 61 are formed on each of the upper plate 62 and the bottom plate 63. Thus, the plurality of treatment fluid holes 61 are formed on almost the entire surface of the punching plate 60.

In this embodiment, two innermost bubble supply pipes 51 out of the eight bubble supply pipes 51 are disposed inside the recess 65 of the punching plate 60. The remaining six bubble supply pipes 51 are disposed on the upper plate 62 and outside the recess 65. Thus, the two bubble supply pipes 51 disposed inside the recess 65 out of the eight bubble supply pipes 51 are the lowest. Furthermore, the six bubble supply pipes 51 disposed on the upper plate 62 are higher as they are closer to the outside (i.e., as a distance from the recess 65 is increased).

Each of the eight bubble supply pipes 51 is an elongated tubular component with bubble holes aligned in a row on its upper surface that are not illustrated. The bubble supply pipes 51 are made of a material with chemical resistance to a treatment fluid, for example, perfluoroalkoxy alkanes (PFA), Poly Ether Ether Ketone (PEEK), or quartz (PFA is used in the embodiment). PFA, which is one of fluorocarbon polymers, has superior chemical resistance but easily becomes warped. Thus, the elongated bubble supply pipes 51 are relatively subject to warping. For this reason, each of the bubble supply pipes 51 is supported and fixed by support guides 58 above the punching plate 60. The support guides 58 are rod-shaped support components. Specifically, pairs of the support guides 58 are mounted upright at a plurality of portions on the punching plate 60. These support guides 58 support the bubble supply pipes 51 made of PFA. These can reduce warping of the bubble supply pipes 51 and increase the straightness.

The bubble holes aligned on each of the bubble supply pipes 51 are disposed between the adjacent substrates W held by the lifter 20. Thus, bubbles formed by ejection of the gas from the bubble holes aligned on each of the bubble supply pipes 51 rise between the adjacent substrates W.

As illustrated in FIG. 7, when the lifter 20 is lowered to the immersion position at which the entire substrates W are immersed in the treatment fluid in the treatment chamber 10 with the liquid-saving specification designed to reduce the amount of the treatment fluid, the extremity 22a of the back plate 22 very closely approaches the bubble supply pipes 51. Since the two innermost bubble supply pipes 51 approached by the extremity 22a out of the eight bubble supply pipes 51 are disposed inside the recess 65 of the punching plate 60, the two bubble supply pipes 51 are lower than the other bubble supply pipes 51. Thus, when the lifter 20 is lowered to the immersion position, the extremity 22a of the back plate 22 can be prevented from hitting the two bubble supply pipes 51.

The controller 70 controls various operating mechanisms provided in the substrate treatment apparatus 100. The controller 70 also controls operations of the treatment part 121. The controller 70 is similar in hardware configuration to typical computers. Specifically, the controller 70 includes a CPU that is a circuit for performing various computation processes, a ROM or read-only memory for storing a basic program, a RAM or readable/writable memory for storing various pieces of information, and a storage (e.g., a magnetic disk) for storing, for example, control software and data. The controller 70 is electrically connected to, for example, the valve 37 of the treatment fluid supplying part 30 and the gas supplying mechanisms 53, and controls operations of these.

The storage of the controller 70 stores a recipe defining procedures and conditions for treating the substrates W (hereinafter referred to as a "treatment recipe"). The substrate treatment apparatus 100 obtains the treatment recipe, for example, entered and stored in the storage by an operator of this apparatus through a graphical user interface (GUI). Alternatively, the treatment recipe may be stored in the storage after a host computer that manages a plurality of substrate treatment apparatuses 100 passes the treatment recipe to the substrate treatment apparatus 100 through communication. The controller 70 controls the operations of, for example, the gas supplying mechanisms 53 based on the description in the treatment recipe stored in the storage, so that the surface treatment on the substrates W proceeds as described in the treatment recipe.

Next, treatment operations in the treatment part 121 with the aforementioned structures will be described. In the treatment part 121 according to this embodiment, the treatment fluid overflowing from the inner chamber 11 to the outer chamber 12 in the treatment chamber 10 and spilled from the outer chamber 12 returns to the inner chamber 11, so that the treatment fluid is circulating. Specifically, the treatment fluid flowing from the outer chamber 12 to the pipe 32 is sent out to the nozzle 31 by the pump 33. Here, the heater 34 heats the treatment fluid flowing through the pipe 32 as necessary. The flow adjustment valve 36 defines the flow rate of the treatment fluid flowing through the pipe 32. Furthermore, the drainage part 40 drains a spent treatment fluid from the treatment chamber 10 as necessary. The chemical solution supplying part 80 and the DIW supplying part 90 supply new treatment fluids to the treatment chamber 10. Polysilicon is etched using strong alkaline TMAH as a treatment fluid in this embodiment.

The treatment fluid fed to the nozzle 31 is ejected from the nozzle 31 toward the upper portion of the inner chamber 11. The treatment fluid ejected from the nozzle 31 hits the distribution plate 15 and spreads in the horizontal direction along the plane of the distribution plate 15. The treatment fluid spread by the distribution plate 15 in the horizontal direction reaches the punching plate 60 and passes through the plurality of treatment fluid holes 61. Then, the treatment fluid rises from the plurality of treatment fluid holes 61 to form a laminar flow of the treatment fluid moving upward in the inner chamber 11. The treatment fluid reaching the upper end of the inner chamber 11 overflows into the outer chamber 12.

The substrates W are immersed in the treatment fluid while the laminar flow of the treatment fluid moving upward is formed in the treatment chamber 10. Specifically, the lifter 20 receives, at the lifting position above the treatment chamber 10, the plurality of substrates W transported by the main transport robot 180. The substrates W are placed on the three retention bars 21 and held by the lifter 20. Subsequently, the controller 70 operates the driving mechanism 24 to lower the lifter 20, lower the substrates W to the immersion position in the treatment chamber 10, and immerse the substrates W in the treatment fluid. The two innermost bubble supply pipes 51 disposed inside the recess 65 of the punching plate 60 are relatively lower. Thus, even when the lifter 20 lowers the substrates W to the immersion position, the extremity 22a of the back plate 22 is prevented from hitting the two bubble supply pipes 51.

The substrates W are held by the lifter 20 at the immersion position while the laminar flow of the treatment fluid is formed in the treatment chamber 10. This enables the laminar flow of the treatment fluid to flow between the substrates W, thus exposing the surface of the substrates W to the treatment fluid. Consequently, the surface treatment on the substrates W proceeds (etching in this embodiment).

Furthermore, the gas supplying mechanisms 53 of the bubble supplying part 50 feed the gas to the respective bubble supply pipes 51. The gas delivered to each of the bubble supply pipes 51 is ejected from the plurality of bubble holes aligned on the bubble supply pipe 51 into the treatment fluid to form bubbles. The plurality of bubble holes are disposed between the adjacent substrates W held by the lifter 20. Thus, bubbles ejected from the bubble supply pipes 51 rise between the adjacent substrates W. In other words, many bubbles rise near the surface of the substrates W.

When the treatment fluid is alkaline TMAH as in this embodiment, the lower the concentration of dissolved oxygen in the treatment fluid is, the higher an etching rate becomes. When the plurality of bubble supply pipes 51 supply nitrogen bubbles in the treatment fluid, the concentration of dissolved oxygen in the treatment fluid decreases. This can consequently increase the etching rate of the substrates W. Even when the treatment fluid is other than TMAH (e.g., phosphoric acid), supply of nitrogen bubbles from the plurality of bubble supply pipes 51 in the treatment fluid causes many bubbles to rise along the surface of the substrates W in the treatment fluid, accelerates the velocity of the treatment fluid, and increases the efficiency of the surface treatment on the substrates W.

After the end of etching for a predetermined time period, the controller 70 operates the driving mechanism 24 to raise the lifter 20 and lift the substrates W from the treatment chamber 10. Then, the main transport robot 180 receives the treated substrates W from the lifter 20. As described above, a series of processes in the treatment part 121 is completed.

In this embodiment, the recess 65 is formed in the punching plate 60, and the two innermost bubble supply pipes 51 out of the eight bubble supply pipes 51 are disposed inside the recess 65 so that the two bubble supply pipes 51 are lower than the other six bubble supply pipes 51. If the two innermost bubble supply pipes 51 are as high as the other bubble supply pipes 51 in the treatment chamber 10 with a relatively small capacity, lowering of the lifter 20 to the immersion position causes a collision between the extremity 22a of the back plate 22 and the two innermost bubble supply pipes 51. Thus, the two innermost bubble supply pipes 51 cannot be installed, and bubbles cannot be uniformly supplied to the surface of the substrates W. In other words, the amount of bubbles supplied into the middle-lower portion of the substrate W is relatively reduced. Consequently, the etching rate in the middle-lower portion of the substrate W is relatively lower than other regions. This impairs the in-plane uniformity in an etching amount.

In this embodiment, the two innermost bubble supply pipes 51 are disposed inside the recess 65 of the punching plate 60 so that the two bubble supply pipes 51 are lower than the other six bubble supply pipes 51. Thus, even when the lifter 20 lowers the substrates W to the immersion position in the treatment chamber 10 with a relatively small capacity, the extremity 22a of the back plate 22 is prevented from hitting the two bubble supply pipes 51. Furthermore, the eight bubble supply pipes 51 including the two innermost bubble supply pipes 51 can uniformly supply bubbles to the surface of the substrates W, while interference between the bubble supply pipes 51 and the lifter 20 is suppressed. This can consequently make the etching rate uniform on the entire surface of the substrates W, and improve the in-plane uniformity in the surface treatment.

While the embodiment according to the present disclosure is described above, various modifications in addition to those described above can be made without departing from the scope and spirit of the disclosure. For example, although the recess 65 of the punching plate 60 is formed by bonding the bottom plate 63 to the upper plate 62 with an opening, the recess 65 is not limited to this. The recess 65 with a bottom may be formed by, for example, cutting the punching plate 60. In other words, the recess 65 may be any as long as it is lower than other regions.

The substrates W are etched using TMAH as the surface treatment in this embodiment. The surface treatment is not limited to this, but may be, for example, cleaning the substrates W using another treatment fluid.

While the invention has been shown and described in detail, the foregoing description is in all aspects illustrative and not restrictive. It is therefore understood that numerous modifications and variations can be devised without departing from the scope of the invention.

What is claimed is:

1. A substrate treatment apparatus that subjects a plurality of substrates to a surface treatment using a treatment fluid, the apparatus comprising:
   a treatment chamber storing the treatment fluid;
   a treatment fluid supplying part supplying the treatment fluid into the treatment chamber;
   a punching plate disposed in the treatment chamber, the punching plate forming, using a treatment fluid hole extending in a vertical direction, a laminar flow of the treatment fluid supplied from the treatment fluid supplying part;
   a lifter holding the plurality of substrates at predetermined intervals in a horizontal direction and moving the plurality of substrates upward and downward, the lifter immersing the plurality of substrates in the treatment fluid stored in the treatment chamber; and
   a plurality of tubular bubble supply pipes disposed above the punching plate to extend in the horizontal direction inside the treatment chamber, the bubble supply pipes supplying, from below the plurality of substrates held by the lifter, bubbles in the treatment fluid stored in the treatment chamber,
   wherein the treatment fluid supplying part includes a nozzle that is disposed below the punching plate and ejects the treatment fluid,
   the punching plate includes: an upper plate in which an opening extending in the vertical direction is formed at a center to be opened along the horizontal direction; and a bottom plate disposed to close a lower portion of the opening of the upper plate,
   the punching plate includes a recess formed by the opening and the bottom plate, and
   a part of the plurality of bubble supply pipes is disposed inside the recess.

2. The substrate treatment apparatus according to claim 1, wherein the lifter includes a V-shaped lower end, and the recess is formed in a center of the punching plate.

3. The substrate treatment apparatus according to claim 1, wherein the plurality of bubble supply pipes are made of a fluorocarbon polymer, and the substrate treatment apparatus further comprises support components supporting each of the bubble supply pipes above the punching plate.

4. The substrate treatment apparatus according to claim 1, wherein the substrate treatment apparatus subjects the plurality of substrates each with a circular main surface to the surface treatment,
   the lifter holds the plurality of substrates such that a center of the main surface of each of the plurality of substrates passes through an axis orthogonal to the vertical direction and middle-lower portions of the plurality of substrates are located at a constant height, and
   the middle-lower portions of the plurality of substrates face the bottom plate of the punching plate when the lifter is located at an immersion position.

* * * * *